(12) United States Patent
Economikos et al.

(10) Patent No.: US 6,403,412 B1
(45) Date of Patent: Jun. 11, 2002

(54) METHOD FOR IN-SITU FORMATION OF BOTTLE SHAPED TRENCH BY GAS PHASE ETCHING

(75) Inventors: Laertis Economikos; Byeongju Park, both of Wappingers Falls, NY (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/304,291

(22) Filed: May 3, 1999

(51) Int. Cl.⁷ .......................................... H01L 21/8234
(52) U.S. Cl. ........................................ 438/238; 438/238
(58) Field of Search ................................. 438/238, 242, 438/243, 244, 245, 246, 248, 391, 386, 702, 387, 388, 389

(56) References Cited

U.S. PATENT DOCUMENTS

| | | |
|---|---|---|
| 4,526,631 A | 7/1985 | Silvestri et al. |
| 5,225,697 A | 7/1993 | Malhi et al. |
| 5,336,912 A | 8/1994 | Ohtsuki |
| 5,358,601 A | 10/1994 | Cathey |
| 5,658,816 A * | 8/1997 | Rajeevakumar ............. 438/386 |
| 6,008,104 A * | 12/1999 | Schrems ..................... 438/386 |
| 6,018,174 A * | 1/2000 | Schrems ..................... 257/296 |

* cited by examiner

Primary Examiner—David Nelms
Assistant Examiner—David Nhu
(74) Attorney, Agent, or Firm—Rosenman & Colin LLP

(57) ABSTRACT

A method fabricates a bottle shaped trench by providing a substrate with a substantially vertical trench therein and a collar about an upper interior portion of the trench and isotropically HCl etching a lower interior portion of the trench under the collar for expansion thereof, wherein the expanded lower interior portion has a wider cross section than that of the upper interior portion of the trench. Further, the method performs potential in-situ process integration with a gas phase doping in the same tool as the one that performed the gas phase etching process.

16 Claims, 6 Drawing Sheets

METHOD FOR IN-SITU FORMATION OF BOTTLE SHAPED TRENCH BY GAS PHASE ETCHING

FIELD OF THE INVENTION

The present invention relates to DRAM cells; and, more particularly, to a method for forming a bottle shaped trench for use with such cells.

DESCRIPTION OF THE PRIOR ART

Recently, as the capacity of a semiconductor memory device such as a DRAM is increased towards 256 Mb and beyond, innovative cell concepts are needed to push the cell area to practical limits. One such concept is to place a trench storage capacitor partially under a cell's access device. Although cell structures using such concepts as the buried trench cell have been proposed in the past, these structures rely on expensive selective epi growth techniques to reduce the trench opening. Selective epi growth, however, typically has a very high defect density and therefore is generally considered to be unsuitable for DRAM applications.

To overcome the drawbacks associated with selective epi growth, there has been proposed a method for forming a bottle shaped trench. This method is disclosed in U.S. Pat. No. 5,658,816, issued on Aug. 19, 1997 and entitled "METHOD OF MAKING DRAM CELL WITH TRENCH UNDER DEVICE FOR 256 MB DRAM AND BEYOND", by Rajeevakumar, in which a bottle shaped deep trench (DT) is fabricated through the use of reactive ion etching (RIE) and oxidation techniques as sketched hereinafter.

That is, referring to FIG. 1A, a trench 210 of a first depth is formed in a doped silicon substrate 200 with a lightly doped epitaxial layer 202 of silicon by using RIE, the trench 210 having an opening of a first cross sectional area at the surface of the substrate 200. Next, nitride collar 212 is formed on the walls of the trench 210 of the first depth by blanketly depositing a layer of nitride on the structure including the trench 210 and then etching anisotropically using RIE to remove this nitride layer from horizontal surfaces.

As described in FIG. 1B, the trench 210 is then further etched to a second depth in the substrate 200 to thereby generate a deepened trench 310.

The deepened trench 310 is now oxidized by thermal oxidation, resulting in an oxide layer 414 on the walls of the trench 310, as shown in FIG. 1C.

Then, referring to FIG. 1D, the deepened trench 310 is expanded to a second cross-sectional area by etching isotropically the oxide layer 414 using a buffered HF etch to thereby obtain a bottle shaped trench 510. This process of oxidation of the trench followed by etching may require more than one iteration to achieve a desired final trench size.

As illustrated above, the above patent uses nitride collar and oxidation of the exposed silicon from the lower portion of the trench, followed by the wet etch (HF) strip of the oxide layer to expand the volume of the void in the trench.

However, the nitride collar is consumed during the above processes because the nitride film is converted slowly to oxide during the oxidation. Although the oxidation of the nitride film proceeds only at ⅕ of the speed of oxidation of silicon, it is pretty obvious that the repeated oxidation will very soon wear the nitride very thin. Accordingly, once the nitride layer is used up, the silicon will be consumed from the upper portion of the trench and reduce the usable area for active area formation.

Furthermore, the thermal oxidation step in the above method could cause dislocations in the silicon substrate due to stress during the oxidation.

Thus a need has arisen for a DRAM cell structure that can take advantage of the area minimization benefits of the prior art trench-under-access device techniques, while avoiding the drawbacks associated with the selective epi growth and the oxidation techniques.

SUMMARY OF THE INVENTION

It is, therefore, one aspect of the present invention to provide a method for fabricating a bottle shaped trench by using gas phase HCl etching to isotropically etch silicon inside the trench.

It is another aspect of the present invention to obtain benefits of potential in-situ process integration with gas phase doping in the same tool as the one that performed the HCl etching process.

These and other aspects and advantages are achieved in the present invention by a method which includes gas phase etching and doping. The method of the present invention comprises the steps of:

(a) providing a substrate with a substantially vertical trench therein and a collar about an upper interior portion of the trench;

(b) gas phase etching a lower interior portion of the trench under the collar to allow the lower interior portion of the trench to be expanded, wherein the expanded lower interior portion has a wider cross section than that of the upper interior portion of the trench; and (c) gas phase doping the substrate about the expanded lower interior portion of the trench.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

A preferred method for fabricating a bottle shaped trench of the present invention is illustrated hereinafter with reference to FIGS. 2A to 2E.

Figure 1A:
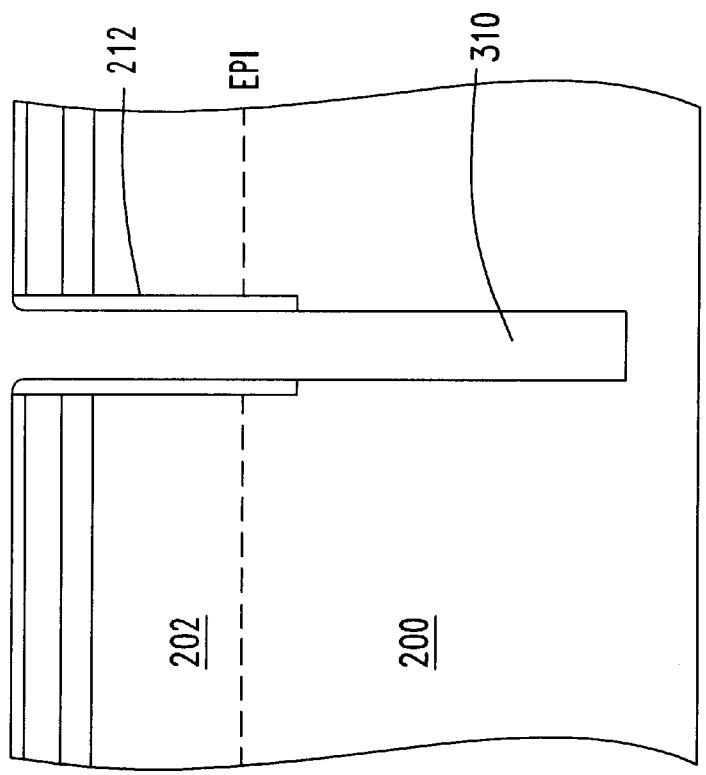
FIGS. 1A to 1D describe schematic cross-sectional views of a conventional trench at various stages in the fabrication thereof.
Figure 1B:
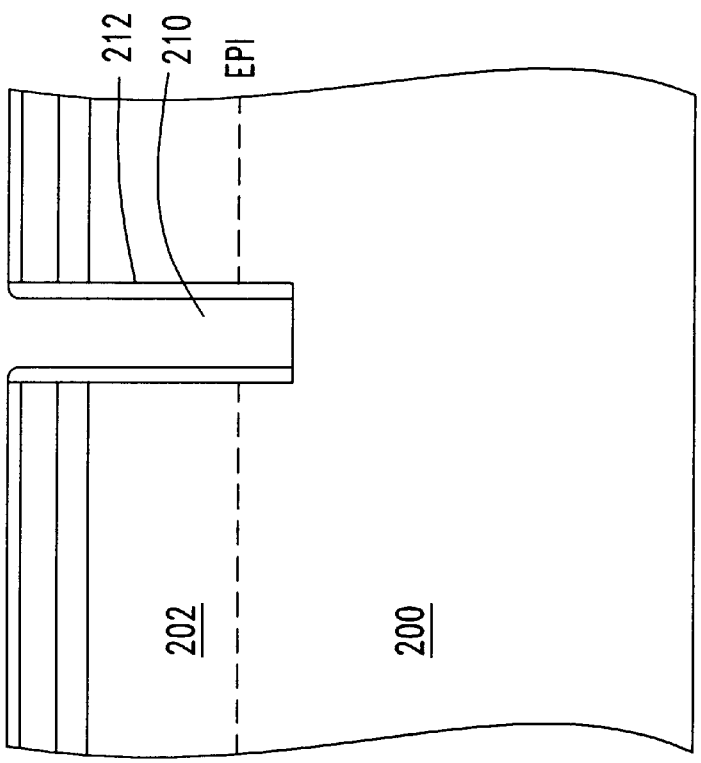
Figure 1C:
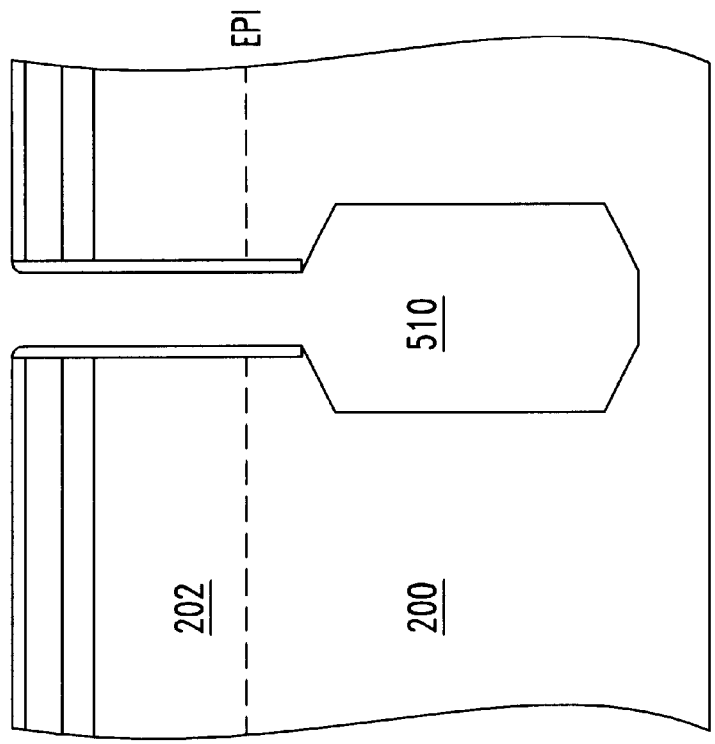
Figure 1D:
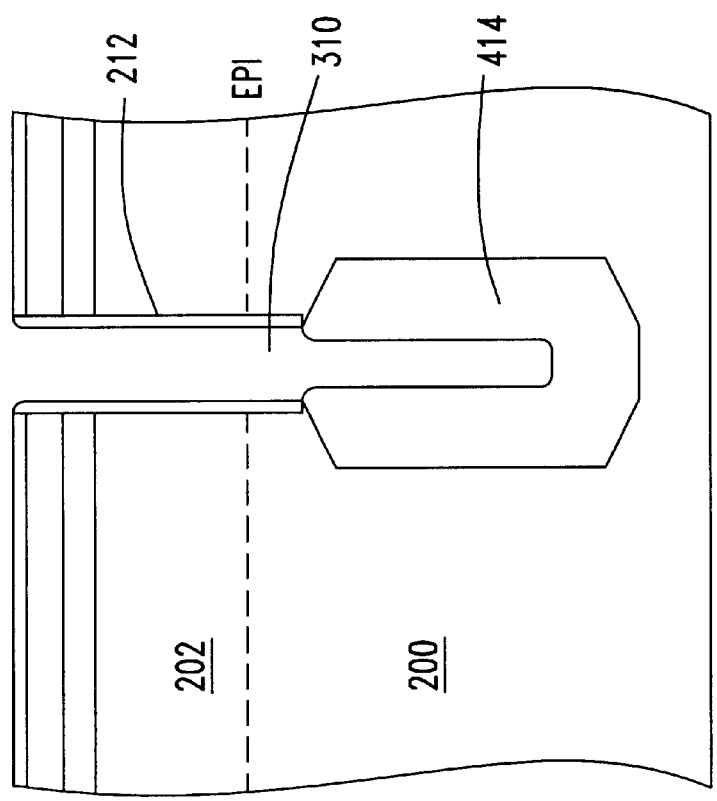
Figure 2A:
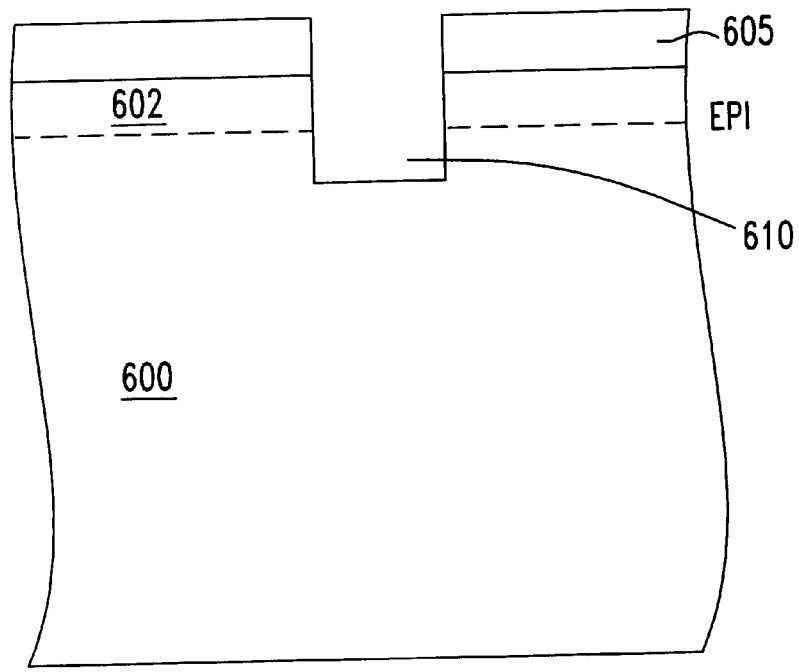
FIGS. 2A to 2E show schematic cross-sectional views of an inventive trench at various stages in the fabrication thereof.

Referring to FIG. 2A, there is provided a doped silicon substrate 600 with a lightly doped epitaxial layer 602 of silicon. Pad layers 605, including, e.g., nitride, oxide and nitride layers, are blanketly deposited on the epitaxial layer 602 of the substrate 600 to form a protective layer for subsequent etching steps.

Then, a trench 610 is etched to about 2 µm into the substrate 600 as follows. First, the pad layers 605 are patterned by using a photo resist and a patterned portion of the pad layers 605 is etched through the use of RIE. Then, by using the remaining portions of the pad layers 605 as a mask, the trench 610 is formed through the use of RIE to a first depth of about 2 μm.

Figure 2B:
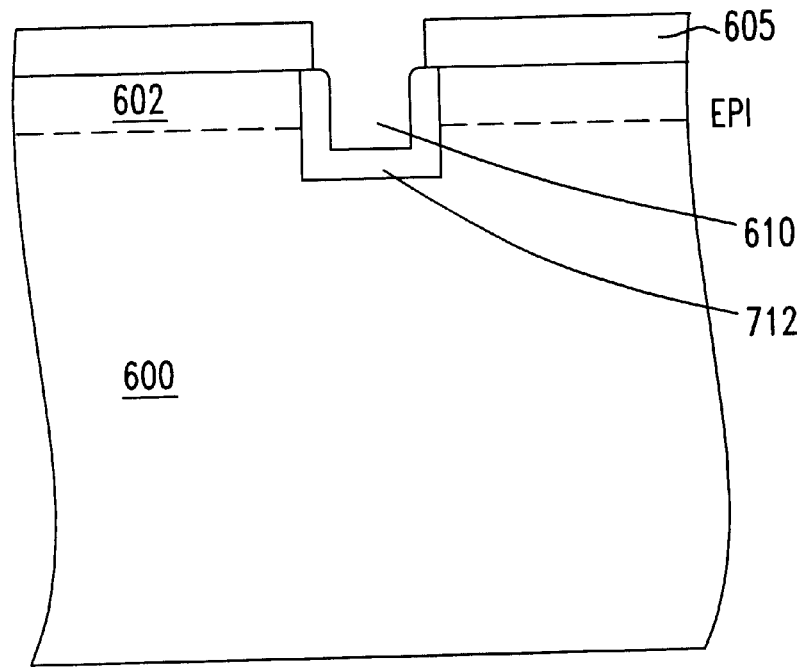

Referring to FIG. 2B, the trench 610 is oxidized by thermal oxidation, resulting in an oxidized layer 712 on the walls of the trench 610. For example, the oxidized layer 712 may have a thickness of about 200 Å including Si consumption of about 88 Å around the walls of the trench 610.

Figure 2C:
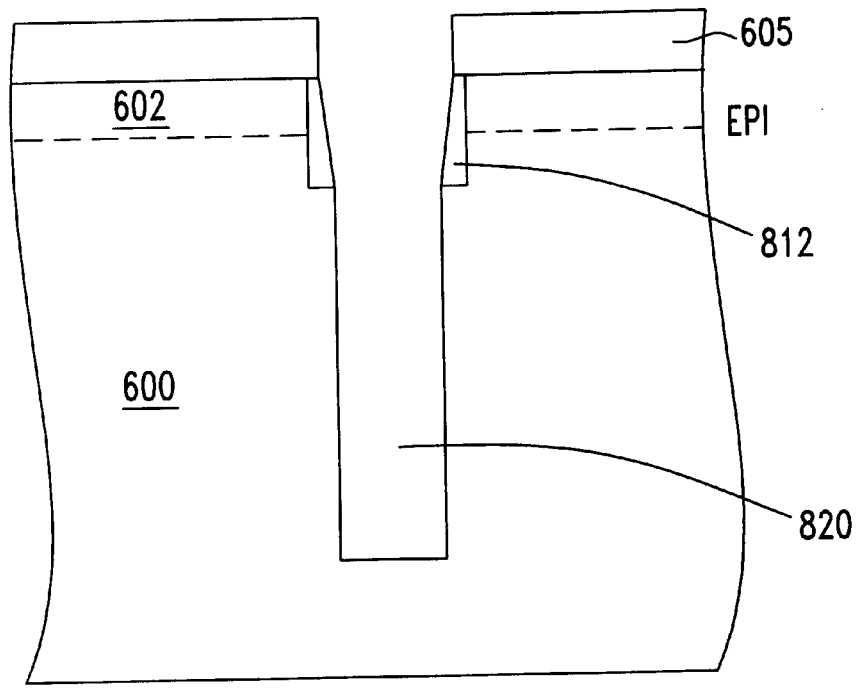

Then, a collar 812 is formed on the walls of the trench 610 in the position shown in FIG. 2C by etching anisotropically the oxidized layer 712 to remove the oxidized portion from the horizontal surface of the oxidized layer 712 through the use of oxide RIE. Accordingly, the trench within the epi region 612 is protected from subsequent etching, e.g., Si RIE and HCl etching, by the collar 812. In addition to the above oxidized silicon, the collar can be formed by using silicon nitride or any other material resistant to Si RIE and HCl etching. For reference, the etch rate of oxide or nitride by HCl gas is negligible.

Next, as shown in FIG. 2C, the trench 610 is further etched to a second depth, e.g., equal to or greater than 8 μm, by using Si RIE to thereby generate a straight DT core 820.

Figure 2D:
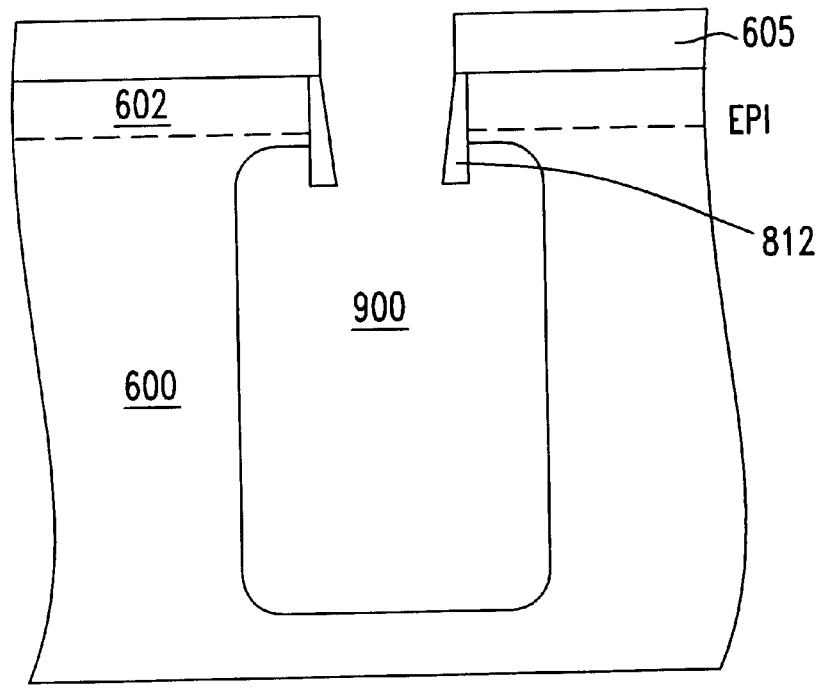

Referring to FIG. 2D, the straight DT core 820 below the collar 812 is then expanded to achieve a desired final trench size by performing an isotropic HCl etching process which can etch the exposed portion of the silicon substrate 600 horizontally and vertically, enabling much more aggressive bottle profile. As a result, the resulting structure with an expanded trench 900 is formed. In this case, since the exposed portion of the silicon substrate 600 is isotropically etched through the HCl etching process, a portion of the silicon substrate 600 covered by the collar 812 is partially etched as can be seen with reference to FIG. 2D.

In general, HCl gas used in the present invention has long been utilized in the industry as a cleaning gas for silicon deposition for its etching property. Unlike the present invention, however, the etch rate in the previous cases utilizing the HCl gas could not be deliberately controlled. Usually, the HCl gas was flowed at a fairly high temperature such as above 1000° C. or even close to 1200° C. to achieve maximum etch rate. In semiconductor process terms, the process was run in a "mass flow controlled" reaction regime, in which the reaction (etch) rate is controlled by the amount of HCl flow and is not affected much by the temperature.

On the other hand, in the present invention, the HCl gas is used at a much lower temperature in such a way that the temperature becomes the major variable limiting the reaction (etch) rate. In the semiconductor processing terms, this regime is called a "reaction rate limited" regime. In this regime, there is plenty of reactant supplies everywhere, this meaning that the bottom of the trench as well as the top of the trench has sufficient amount of HCl gas available. Since the temperature is fairly low, the reaction (etch) rate is primarily limited by the temperature.

Figure 3:
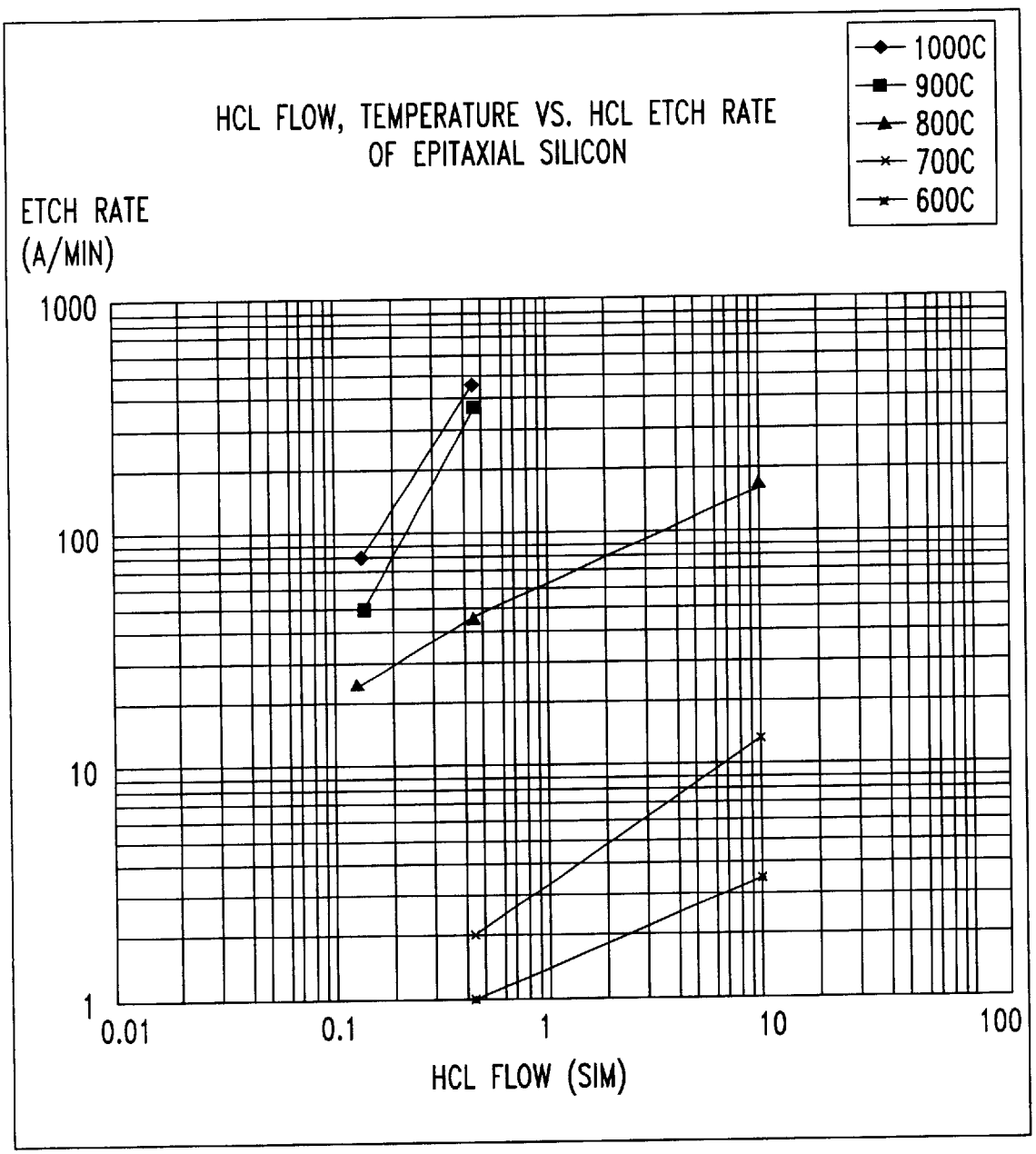
FIG. 3 depicts a graph showing HCl flow and temperature vs. HCl etch rate of epitaxial silicon in a single wafer epi reactor.

Referring to FIG. 3, the crossover from the mass flow controlled reaction regime to the reaction rate limited regime is apparent in a log—log plot of the etch rate at 60 Torr. As can be seen in FIG. 3, in the mass flow controlled reaction regime, the etch rate is linear to the gas flow while in the reaction rate limited regime, the slope is less than 1. This transition is seen between 800° C. and 900° C. in FIG. 3.

The inventive HCl etching process can proceed not only in the RP (reduced pressure) range (which includes 60 Torr) but also at the atmospheric pressure and also in the LP (low pressure) range. Basically, there is no limit to the HCl etching pressure except that the process needs to be doable in semiconductor equipment. Therefore, a processing pressure range of about 50 mTorr to about 1 atm would be all usable.

Depending on the operating pressure regime and the ratio of the gas flow to the size of the reactor, the crossover between the above two process regimes will occur at a different temperature. The crossover temperatures are expected to be somewhere between about 750° C. and about 850° C. in most cases. The inventive HCl etching process operates at a temperature below the crossover temperature so that the process is always in the reaction rate limited regime and is controlled by the temperature.

Although the HCl etching process can be performed in a variety of reactor configurations, it is noted that there are only two most likely tools that this process can be implemented on. One is the conventional LPCVD furnaces. In this configuration, this process will operate in the conventional LPCVD pressure range of 50 mTorr–5 Torr. A batch of wafers will be loaded in a boat (typically made of quartz or silicon carbide) accommodation 50–150 wafers in a load. All the wafers in the same boat will be processed at the same time in the furnace. Another configuration for this process is a single wafer tool operating in either RP or the atmospheric pressure. Although the process would become more difficult because of time constraints, a well optimized process is in principle possible.

As can be noticed, the operation of the process below the process crossover point is the critical point of the present invention. This is necessary in order to insure that the bottom portion of the trench receives comparable etching as the top of the trench, which is in turn critical in increasing the surface area of the trench.

For example, referring back to FIG. 3, the graph shows the etch rates in a single wafer epi reactor. By limiting the etching process to proceed in the reaction rate limited regime, all areas of the exposed silicon substrate will be etched at almost identical etch rate. The data in FIG. 3 indicates that this regime is achievable preferably at around 800° C. with 0.5–10 slm HCl flow at 60 Torr. Also a test in the LPCVD process conditions of 5 Torr, although performed in a single wafer reactor, demonstrated the feasibility of a similar process using identical chemistry in a batch type LPCVD reactor.

After the HCl or $H_2$ etching process being performed, in-situ $H_2$ bake/cleaning of the surface of the expanded trench 900 (blowing off dangling silicon atoms by $H_2+Si>SiH_2$ reaction) at high temperature can be followed to prepare a smooth surface in the expanded trench 900.

Figure 2E:
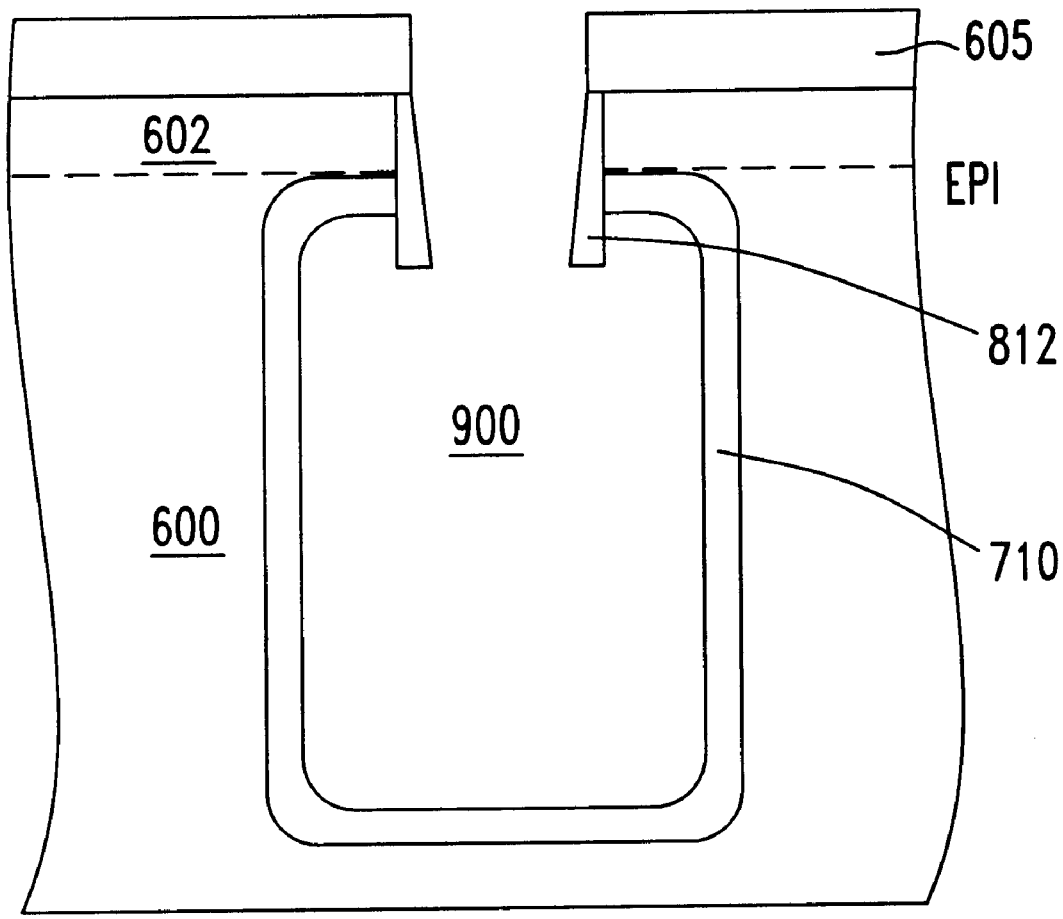

Then, as shown in FIG. 2E, gas phase doping in the same chamber with $AsH_3$ will be performed to form a buried plate 910.

Furthermore, the presence of $H_2$ in $AsH_3/H_2$ mixture during the gas phase doping can be exploited to enhance productivity in the etching and doping.

Then, conventional steps are performed to continue the processing to fabricate the remaining portions of a DRAM cell structure.

In accordance with the present invention, as explained above, the gas phase etching scheme does not require repeated processing even for a removal of large volume of silicon and does not suffer from dislocations in the silicon substrate since there is no stress-inducing oxidation process disclosed in U.S. Pat. No. 5,658,816. Specifically, the HCl etching does not cause any stress on the wafer. Further, the gas phase etching further achieves enhanced uniformity and controllability of the etching process, and has capability to tailor the shape of the bottle shaped trench including very aggressive bottle shape/profile.

In addition, there are added benefits of potential in-situ process integration with a $H_2$ bake/cleaning to prepare a smooth surface or with a gas phase doping within the same tool as the one that performed the gas phase etching, in which case enormous cost savings is expected.

While the present invention has been described with respect to the particular embodiments, it will be apparent to those skilled in the art that various changes and modifications may be made without departing from the spirit and scope of the invention as defined in the following claims.

What is claimed is:

1. A method for forming a bottle shape trench, said method comprising the steps of:

(a) providing a substrate with a substantially vertical trench therein and a collar about an upper interior portion of the trench;

(b) gas phase etching a lower interior portion of the trench under the collar to expand the lower interior portion of the trench, wherein the expanded lower interior portion has a wider cross section than that of the upper interior portion of the trench; and (c) thermally activating a gas phase to affect said gas phase etching step.

2. The method as recited in claim 1, wherein the etching step is performed by using HCl gas.

3. The method as recited in claim 2, wherein the etching step is carried out in a reaction rate limited regime.

4. The method as recited in claim 3, wherein the etching is carried out in an LPCVD batch furnace, wherein in the etching step, the temperature is between 700 C. and 850 C. and preferably between 725 C. and 800 C., and preferably between 725 C. and 800 C., the pressure is approximately between 50 mTorr and 5 Torr, and the HCl flow range is from about 0.5 slm to 10 slm.

5. The method as recited in claim 3, wherein the etching is carried out in a single wafer tool operating either at reduced pressure between 5 Torr and 760 Torr or at atmospheric pressure, wherein in the etching step, the temperature is approximately between 750 C. and 850 C., preferably between 800 C. and 850 C., and the HCl flow range is from about 0.5 slm to 30 slm.

6. The method as recited in claim 3, wherein, in the etching step, the temperature is about 800° C., the HCl flow is in the range from about 0.5 to about 10 slm, and the pressure is in the range from about 50 mTorr to about 1 atm.

7. The method as recited in claim 3, wherein the collar is made of material resistant to the HCl gas.

8. The method as recited in claim 7, wherein the collar is made of oxidized silicon.

9. The method as recited in claim 7, wherein the collar is made of silicon nitride.

10. The method as recited in claim 2 further comprising the step of gas phase doping the substrate about the expanded lower interior portion of the trench.

11. The method as recited in claim 10, wherein the etching and the doping steps are performed in an LPCVD reactor or in a single wafer processing tool and each step is carried out in-situ—ie.

12. The method as recited in claim 11, wherein the doping step is performed with $AsH_3$.

13. The method as recited in claim 11, wherein the doping step is performed with $AsH_3/H_2$ mixture.

14. The method as recited in claim 10, further comprising, between the etching and the doping steps, the step of performing bake/cleaning of the surface of the expanded lower interior portion of the trench.

15. The method as recited in claim 14, wherein the bake/cleaning step is performed by using $H_2$ gas.

16. The method as recited in claim 15, wherein the bake/cleaning step is carried out in-situ with the etching and the doping steps in the same reactor.

* * * * *